United States Patent [19]
Churchill

[11] Patent Number: 5,907,255
[45] Date of Patent: May 25, 1999

[54] DYNAMIC VOLTAGE REFERENCE WHICH COMPENSATES FOR PROCESS VARIATIONS

[75] Inventor: Jonathan F. Churchill, Berkshire, United Kingdom

[73] Assignee: Cypress Semiconductor, San Jose, Calif.

[21] Appl. No.: 08/824,369

[22] Filed: Mar. 25, 1997

[51] Int. Cl.$^6$ .................................................. H03H 11/26
[52] U.S. Cl. ........................ 327/262; 327/276; 327/378; 327/362
[58] Field of Search ............................. 327/74, 276, 277, 327/378, 379, 362, 443, 108, 262

[56] References Cited

U.S. PATENT DOCUMENTS

| | | | |
|---|---|---|---|
| 4,723,108 | 2/1988 | Murphy et al. | 323/315 |
| 4,817,055 | 3/1989 | Arakawa et al. | 365/185.23 |
| 4,843,255 | 6/1989 | Stuebing | 307/273 |
| 4,894,791 | 1/1990 | Jiang et al. | 364/570 |
| 5,021,684 | 6/1991 | Ahuja et al. | 307/443 |
| 5,113,336 | 5/1992 | Takahashi et al. | 363/61 |
| 5,243,228 | 9/1993 | Maruyama et al. | 327/534 |
| 5,327,072 | 7/1994 | Savignac et al. | 323/313 |
| 5,376,840 | 12/1994 | Nakayama | 327/537 |
| 5,396,110 | 3/1995 | Houston | 327/172 |
| 5,434,820 | 7/1995 | Kim | 365/189.09 |
| 5,453,709 | 9/1995 | Tanimoto et al. | 327/276 |
| 5,686,824 | 11/1997 | Rapp | 323/313 |
| 5,744,996 | 4/1998 | Kotzle et al. | 327/534 |
| 5,760,618 | 6/1998 | Deliyannides et al. | 327/108 |

FOREIGN PATENT DOCUMENTS 62-261215  11/1987  Japan .

*Primary Examiner*—Kenneth B. Wells
*Assistant Examiner*—Minh Nguyen
*Attorney, Agent, or Firm*—Christopher P. Maiorana; Maiorana & Acosta, P.C.

[57] ABSTRACT

A dynamic voltage reference circuit for generating one or more control signals for use in controlling a delay circuit or other circuit that requires compensation for process variations. The control signals are generated without drawing DC current at times other than when the active edge is propagating through the delay circuit. As a result, a reference generator with reduced power consumption is realized.

20 Claims, 3 Drawing Sheets

5,907,255

DYNAMIC VOLTAGE REFERENCE WHICH COMPENSATES FOR PROCESS VARIATIONS

FIELD OF THE INVENTION

The present invention relates to voltage reference circuits generally and, more particularly, to a voltage reference generator circuit that draws a minimum of static DC current.

BACKGROUND OF THE INVENTION

There are many requirements in CMOS technologies for circuits which are insensitive or less sensitive to process variations. An example of such a circuit is an output buffer circuit that reduces noise across process corners. FIG. 1 illustrates a conventional circuit 10 implementing such an output buffer circuit. The circuit 10 generally comprises a voltage reference block 12, a capacitor 14, a transistor MP1, a transistor MP2 and a transistor MN1. The voltage reference block 12 produces a signal VREF which generally controls the strength of the transistor MP1. During a condition when a high to low transition of the signal IN is received at the gates of the transistors MP2 and MN1, a low to high transition is generally presented at the node OUT. The signal at the node OUT is generally less sensitive to processing variations of the transistors MP1 and MP2. Examples of similar circuits may be found in U.S. Pat. No. 4,723,108.

Generally, the reference voltage block 12 draws a static direct current and tends to smooth the signal VREF. The capacitor 14 generally makes the circuit difficult to quickly turn on or off, which is a counterpart to compensating for processing variations. However, in applications of low power circuits or circuits where the static DC current must be zero, the voltage reference block 12 cannot be switched rapidly due to the smoothing effect of the capacitors. Certain circuits require only a reduction in process sensitivity rather than a full process correction, which presents options in circuit design.

FIG. 2 illustrates a conventional pulse generator circuit 30. The circuit 30 generally comprises a delay block 32, a NOR gate 34, an inverter 36, a NOR gate 38, an inverter 39 and an inverter 40. Other conventional delay circuits may include a chain of inverters or a chain of inverters driving RC networks. While the circuit 30 may provide a fixed amount of delay, it is generally not stable across process variations. It would be desirable to provide a reference circuit similar to that shown in FIG. 1 to provide a reduction in process sensitivity in circuits similar to the delay circuit shown in FIG. 2.

SUMMARY OF THE INVENTION

The present invention concerns a dynamic voltage reference circuit for generating one or more control signals for use in controlling a delay circuit or other circuit that requires compensation for process variations. The control signals are generated without drawing DC current at times other than when the active edge is propagating through the delay circuit. As a result, a reference generator with reduced power consumption is realized.

The objects, features and advantages of the present invention include providing a dynamic voltage reference generator that will generate one or more control signals that provide compensation for process variation and draw a minimum of DC current.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
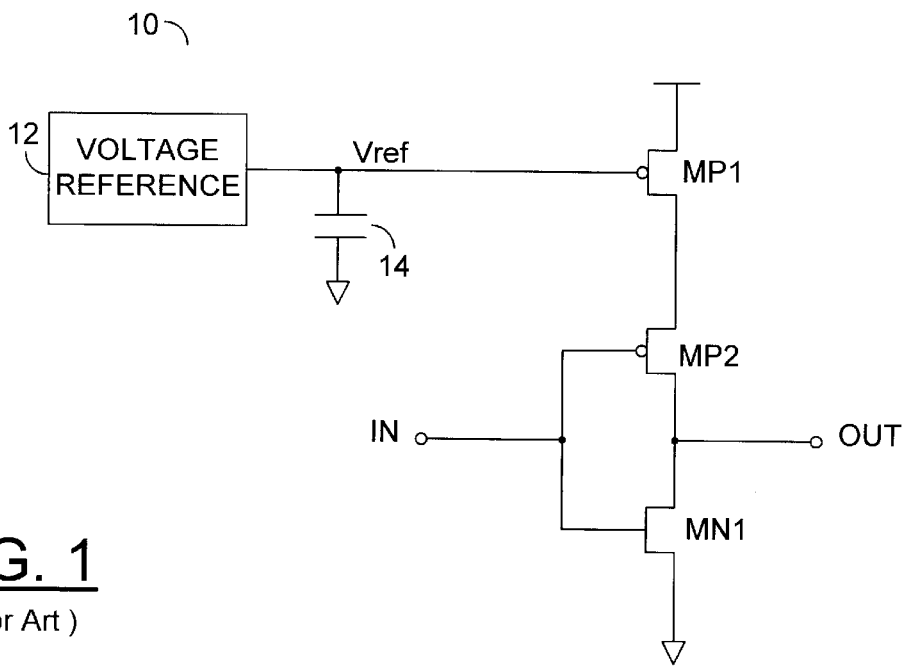
FIG. 1 is a block diagram of a conventional reference circuit implemented in an output buffer.
Figure 2:
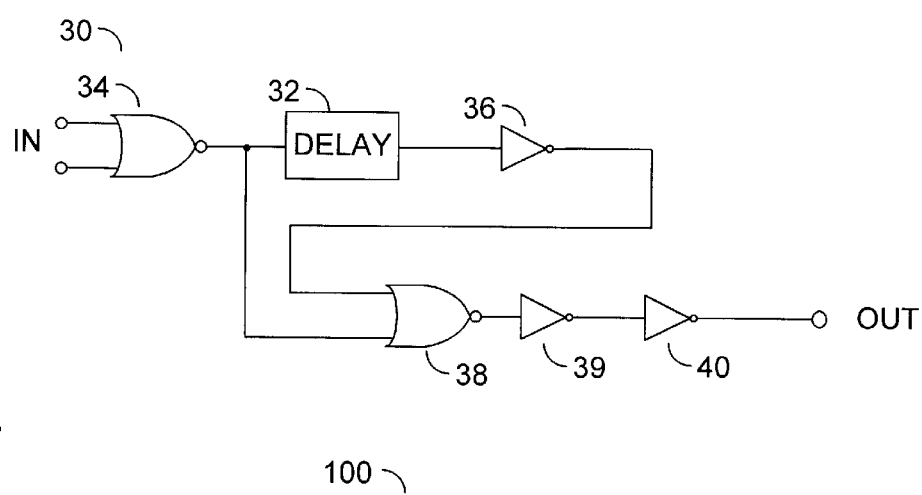
FIG. 2 is a conventional pulse generator circuit.
Figure 3:
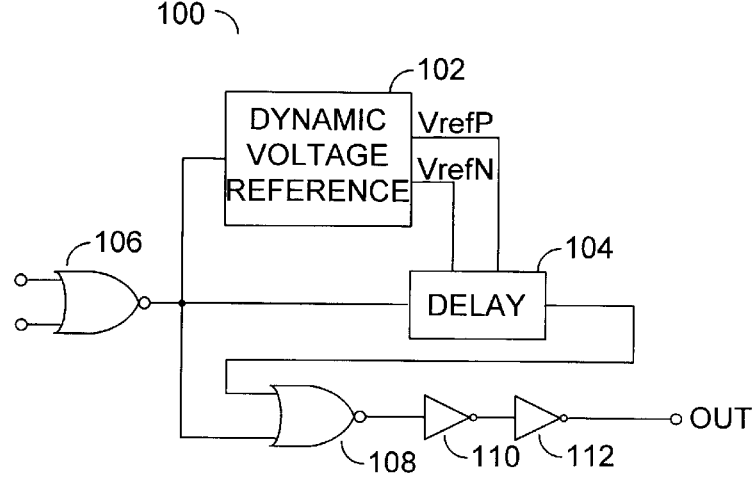
FIG. 3 is a block diagram of the present invention implemented in the context of a pulse generator circuit.

Referring to FIG. 3, a circuit 100 is shown incorporating a preferred embodiment of the present invention. The circuit 100 generally comprises a dynamic voltage reference block 102, a delay block 104, a NOR gate 106, a NOR gate 108, an inverter 110 and an inverter 112. The circuit 100 functions in a similar fashion to the conventional delay circuit 30 illustrated in FIG. 2. The circuit 100 provides an improvement in that the amount of delay realized by the delay block 104 is controlled by the signals VrefP and VrefN generated by the dynamic voltage reference block 102. The NOR gate 106 receives an input signal IN which may be presented to the dynamic voltage reference block 102, the delay block 104 and a first input of the NOR gate 108. The delay block 104 may present a signal to a second input of the NOR gate 108. The NOR gate 108 may present an output signal OUT through the inverters 110 and 112. The signals VrefP and VrefN are generated such that the output signal OUT reflects a constant pulse width with respect to the input signal IN generally independently of process variations.

Figure 4:
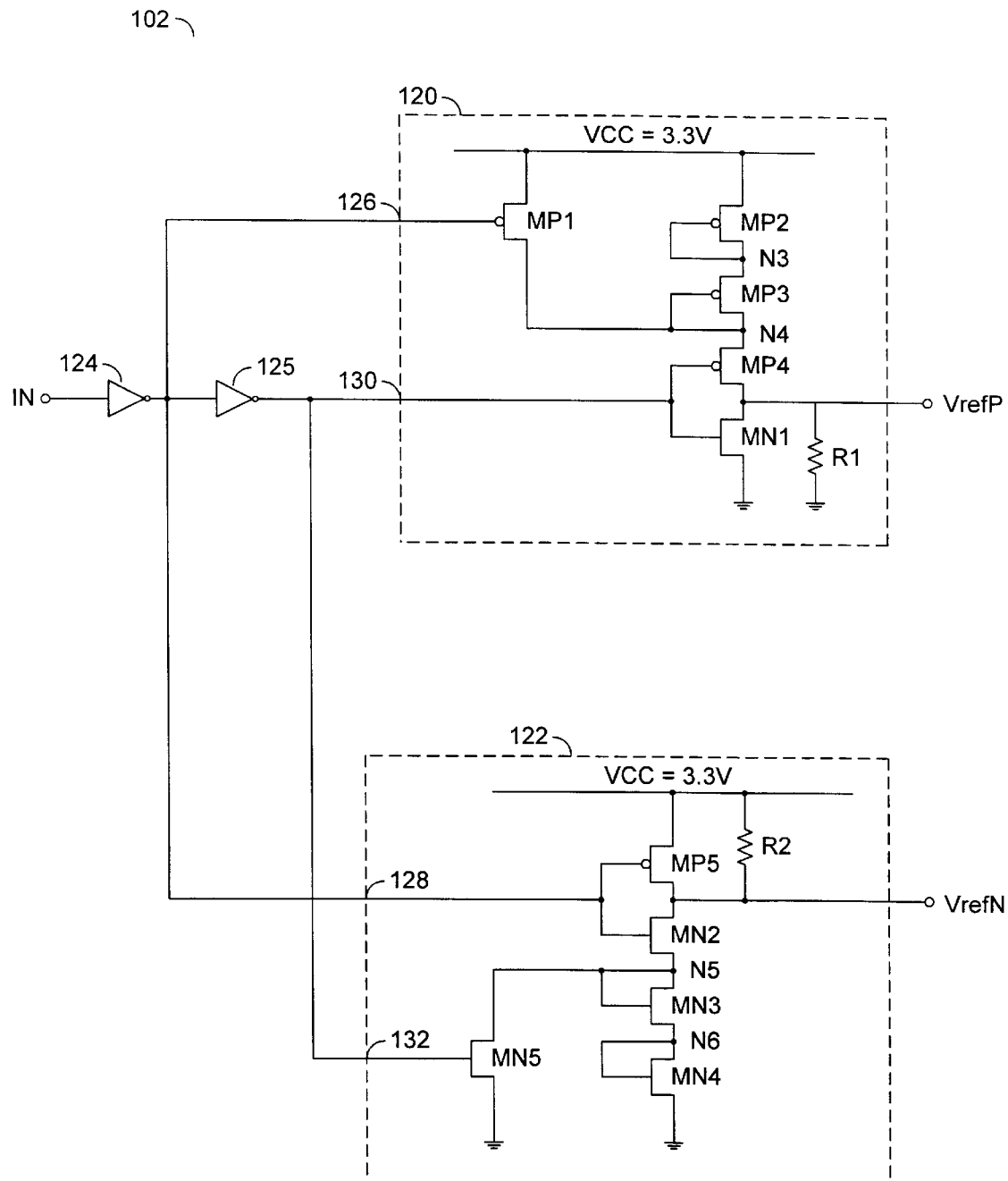
FIG. 4 is a block diagram of a preferred embodiment of the present invention.

Referring to FIG. 4, a circuit diagram of the dynamic voltage reference block 102 is shown. The dynamic voltage reference block 102 generally comprises a first section 120 and a second section 122. The input signal IN may be presented through an inverter 124 to an input 126 of the first section 120 as well as to an input 128 of the second section 122. The signal IN may also be presented, through an inverter 125, to an input 130 of the first section 120 as well as to a second input 132 of the second section 122. The first section 120 generally presents the signal VrefP while the second section 122 generally presents the signal VrefN.

The first section 120 generally comprises a transistor MP1, a transistor MP2, a transistor MP3, a transistor MP4 and a transistor MN1. The signal received at the first input 126 is generally presented to the gate of the transistor MP1. The source of the transistor MP1 as well as the source of the transistor MP2 are generally coupled to a supply voltage VCC which may be, in one example, 3.3 volts. However, other supply voltages, such as a 2.5 volt supply, may be used to meet the design criteria of a particular application. The gate of the transistor MP2 as well as the drain of the transistor MP2 may be coupled to a source of the transistor MP3 at a node N3. The gate and the source of the transistor MP3 are generally coupled to the source of the transistor MP6 at a node N4. The signal received at the input 130 may be presented to a gate of the transistor MP4 as well as to a gate of the transistor MN1. The drain of the transistor MP6 is generally coupled to the source of the transistor MN1 and presents the signal VrefP. The drain of the transistor MN1 is generally coupled to ground. The signal VrefP may also be coupled to ground through a resistor R1. The number of transistors connected between the node N3 and the supply voltage VCC may be increased or decreased accordingly to meet the design criteria of a particular application. Specifically, additional transistors may be implemented for operation at higher supply voltages. Additionally, a smaller number of transistors may be implemented to operate at lower supply voltages.

The second section 122 generally comprises a transistor MP5, a transistor MN2, a transistor MN3, a transistor MN4 and a transistor MN5. The signal received at the first input 128 is generally presented to the gate of the transistor MP5 as well as to the gate of the transistor MN2. The drain of the transistor MP5 is generally coupled to the source of the transistor MN2 and presents the signal VrefN. The signal VrefN is also coupled to a supply voltage VCC through a resistor R2. The source of the transistor MP5 is generally coupled to the supply voltage VCC. The second input 132 is generally coupled to the gate of transistor MN5. The source of the transistor MN5 is generally coupled to the drain of the transistor MN2, the source of the transistor MN3 and the gate of the transistor MN3 at a node N5. The drain and the gate of the transistor MN4 are generally coupled to the source of the transistor MN3 at a node N6. The source of the transistor MN4 is generally coupled to ground. The number of transistors coupled between the node N5 and ground may be adjusted accordingly to meet the design criteria of a particular application. Specifically, the number of transistors may be increased to operate at higher supply voltages. Additionally, a smaller number of transistors may be implemented to operate at lower supply voltages.

Figure 5:
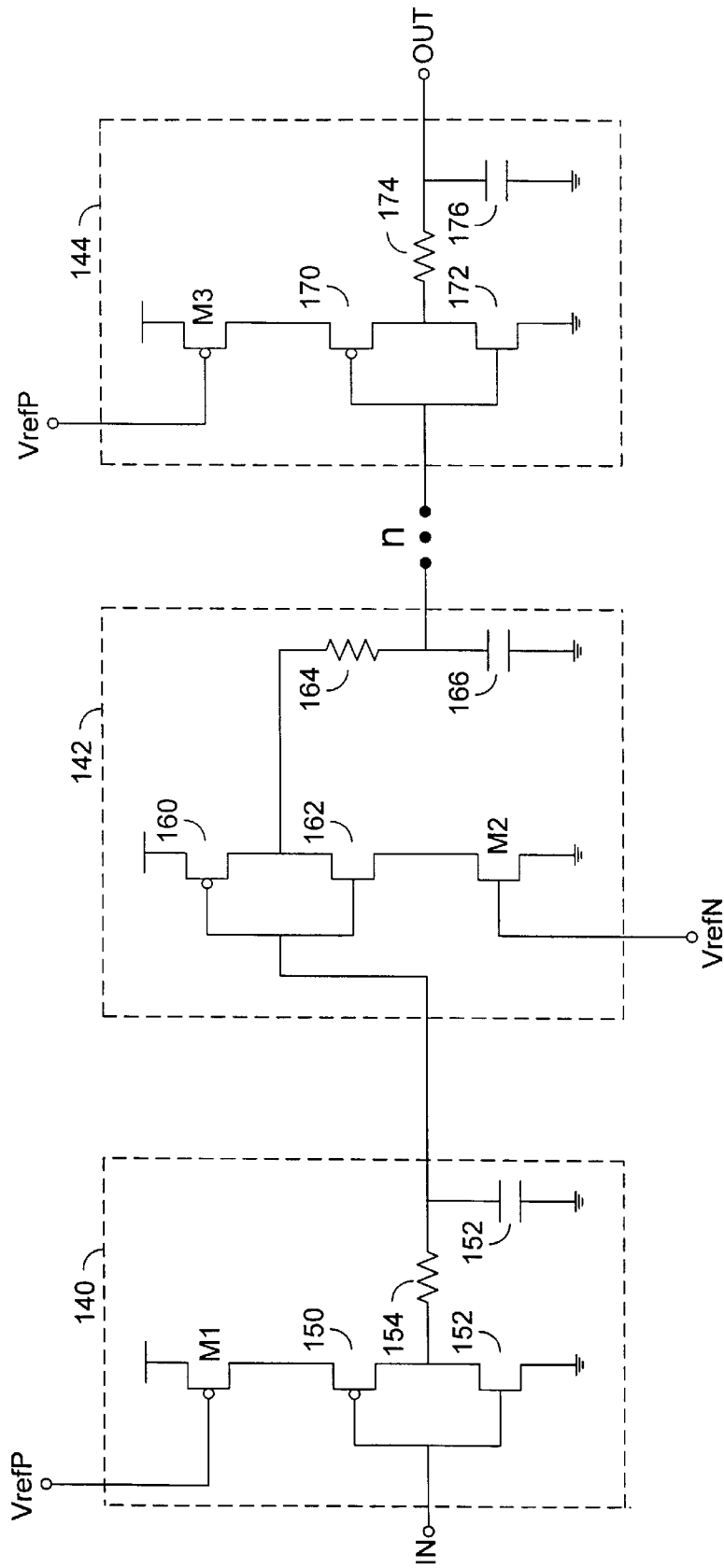
FIG. 5 is a circuit diagram of the delay block illustrated in FIG. 3.

Referring to FIG. 5, the delay circuit 104 is shown in greater detail. The delay circuit 104 generally comprises a first section 140, a second section 142 and a third section 144. The first section 140 generally comprises a transistor M1 having a gate coupled to the signal VrefP, a transistor 150, a transistor 152, a resistor 154, and a capacitor 156. The signal IN is generally presented to the gates of the transistors 150 and 152. The resistor 154 is generally coupled between the transistors 150 and 152 and presents a signal to the second section 142. The capacitor 156 is generally coupled between the resistor 154 and ground. The second section 142 generally receives the signal from the first section 140 at the gates of the transistors 160 and 162. A resistor 164 is generally coupled between the transistors 160 and 162 which presents a signal to the third section 144. The capacitor 166 is generally coupled between the resistor 164 and ground. The transistor M2 generally receives the signal VrefN. The third section 144 has a similar configuration as the first section 140. The transistor M3 has a gate that may receive the signal VrefP.

The signal VrefP, which is generally presented to the gate of the transistors M1 and M3, generally controls the strength of the transistors M1 and M3 respectively. Similarly, the signal VrefN which is generally presented to the gate of the transistor M2, generally controls the strength of the transistor M2. The number of sections 140~144 may be increased, which generally increases the delay between the signal In and the signal OUT in order to meet the design criteria of a particular application.

Referring back to FIG. 4, the signal VrefP initially starts at a ground voltage VSS and the signal VrefN initially starts at the supply voltage VCC. The resistors R1 and R2 start out shorted with no current flowing in the dynamic reference block 102 since the transistors MP4 and MN2 are generally off. Additionally, the diode chains formed by the transistors MP2 and MP3 as well as the transistors MN3 and MN4 are generally shorted.

When considering the operation of the first section 120, when the signal IN transitions low, the transistor MP4 is generally turned on and the transistor MP1 turns off. The signal VrefP (initially at VSS) is connected to the node N4 (initially at VCC). The loading on the signal VrefP plus the resistor R1 generally ensures that the voltage at the node N4 drops until the transistors MP2 and MP3 turn on. A voltage is then developed at the signal VrefP that is generally a function of the processing of p-channel transistors, i.e., the voltage is higher for "fast" processing and lower for "slow" processing. In one embodiment, the design target is for the signal VrefP to equal VSS for slow processing and to approximately equal VCC/2 for fast processing. This generally ensures that the delay chain, created by the sections 140~144, sees no effective voltage change in the signal VrefP during slow processing conditions when the delay chain is active.

The signal VrefP is also a function of the resistance of the resistor R1, but this function has fewer process parameters that affect its value. The resistor R1 may be implemented as a poly resistor where a narrower width equals a faster process and results in the signal VrefP adjusting to a higher voltage, which is generally self correcting. Although sheet resistance may work in the opposite direction to that required for process correction, the effect is generally minimized. The circuit 102 is generally reset by a low to high transition by the overall operation of the first section 120. The second section 122 generates the signal VrefN which generally functions in a similar fashion as the first section 120.

Application of the circuit 102 may be in a delay element which requires a single edge to be process corrected. For example delaying clock edges in setup and hold paths, or in clock deskewing. The strength of the transistors changes depending on a number of factors. Many of these factors are related to the transistor processing variations. For example, the transistor threshold voltage Vt may vary from wafer to wafer. Other factors may be environmentally related (e.g., temperature and supply voltage). The circuit 102 may correct for all of these variations to a greater or lesser extent.

While the invention has been particularly shown and described with reference to the preferred embodiments thereof, it will be understood by those skilled in the art that various changes in form and details may be made without departing from the spirit and scope of the invention.

I claim:

1. An apparatus comprising:
    a first circuit configured to generate a first signal varying between a first and second voltage in response to (i) an input signal and (ii) a supply voltage, wherein the magnitude of one or more of said first and second voltages are compensated in response to process variations;
    a second circuit configured to generate a second signal varying between a third and fourth voltage in response to (i) said input signal and (ii) said supply voltage, wherein the magnitude of one or more of said third and fourth voltages are compensated in response to process variations;
    a third circuit configured to delay said first and second reference voltage signals in response to said input signal; and
    a fourth circuit configured to combine said input signal and at least one of said first and second reference voltage signals to generate an output pulse.

2. The apparatus according to claim 1 wherein the generation of said first and second signals draws a minimum of DC current.

3. The apparatus according to claim 1 wherein said first and second signals provide voltage levels for use in driving a delay circuit.

4. The apparatus according to claim 3 wherein said delay circuit produces a constant delay over process variations.

5. The apparatus according to claim 4 wherein said delay circuit further comprises:

one or more fifth circuits each configured to generate a fixed delay in response to said first signal; and one or more sixth circuits each configured to generate a fixed delay in response to said second signal.

6. The apparatus according to claim 1 wherein:

said first signal comprises a first reference signal; and said second signal comprises a second reference signal, wherein said first and second reference signals compensate for process variations.

7. The apparatus according to claim 1 wherein said first and second signals transition to a first predetermined voltage during strong process conditions and a second predetermined voltage during weak process conditions.

8. The apparatus according to claim 7 wherein:

said first predetermined voltage is VCC/2; and said second predetermined voltage is VCC.

9. The apparatus according to claim 1 wherein said process variations include variations in manufacturing said first and second circuits, variations in temperature and variations in supply voltages.

10. An apparatus comprising:

means for generating a first signal varying between a first and second voltage in response to (i) an input signal and (ii) a supply voltage, wherein the magnitude of one or more of said first and second voltages are compensated in response to process variations;

means for generating a second signal varying between a third and fourth voltage in response to (i) said input signal and (ii) said supply voltage, wherein the magnitude of one or more of said third and fourth voltages are compensated in response to process variations;

means for delaying said first and second reference voltage signals in responses to said input signal; and means for combining said input signal and at least one of said first and second reference voltage signals to generate an output pulse.

11. The apparatus according to claim 10 wherein said first and second signals draw a minimum of DC current.

12. The apparatus according to claim 10 wherein said first and second signals provide voltage levels for use in driving a delay means.

13. The apparatus according to claim 12 wherein said delay means generates a constant delay over process variations.

14. The apparatus according to claim 13 wherein said delay means further comprises:

means for generating a fixed delay in response to said first signal; and means for generating a fixed delay in response to said second signal.

15. The apparatus according to claim 10 wherein:

said first signal comprises a first reference signal; and said second signal comprises a second reference signal, wherein said first and second reference signals compensate for process variations.

16. The apparatus according to claim 10 wherein said first and second signals transition to a first predetermined voltage during strong process conditions and a second predetermined voltage during weak process conditions.

17. The apparatus according to claim 16 wherein:

said first predetermined voltage is VCC/2; and said second predetermined voltage is VCC.

18. The apparatus according to claim 10 wherein said process variations include variations in manufacturing said first and second circuits, variations in temperature and variations in supply voltages.

19. A method comprising the steps of:

generating a first reference voltage signal in response to (i) an input signal and (ii) a supply voltage, wherein the magnitude of said first reference voltage signal varies between a first and second voltage in response to process variations;

generating a second reference voltage signal in response to (i) said input and (ii) said supply voltage, wherein said second reference voltage signal varies between a third and fourth voltage in response to process variations;

delaying said first and second reference voltage signals in response to said input signal; and combining said input signal and at least one of said first and second reference voltage signals to create an output pulse.

20. A method of creating an output pulse comprising:

generating a first reference voltage signal in response to an input signal, wherein the magnitude of said first reference voltage signal varies between a first and second voltage in response to process variations;

generating a second reference voltage signal in response to said input, wherein said second reference voltage signal varies between a third and fourth voltage in response to process variations;

delaying said first and second reference voltage signals in response to said input signal; and combining said input signal and at least one of said first and second reference voltage signals to create said output pulse.

* * * * *